(12) United States Patent
Hong

(10) Patent No.: US 6,596,548 B2
(45) Date of Patent: Jul. 22, 2003

(54) METHOD FOR FABRICATING A CAPACITOR OF A SEMICONDUCTOR DEVICE

(75) Inventor: Kwon Hong, Kyonggi-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/114,251

(22) Filed: Apr. 3, 2002

(65) Prior Publication Data

US 2002/0146882 A1 Oct. 10, 2002

(30) Foreign Application Priority Data

Apr. 9, 2001 (KR) .................................. 2001-18635

(51) Int. Cl.$^7$ .................................................. H01G 7/06
(52) U.S. Cl. ......................................... 438/3; 438/240
(58) Field of Search ....................................... 438/3, 240

(56) References Cited

U.S. PATENT DOCUMENTS

| 4,000,046 A | 12/1976 | Weaver |
| 4,104,704 A | 8/1978 | Weaver |
| 4,488,941 A | 12/1984 | Love |
| 5,858,199 A | 1/1999 | Hanak |
| 5,877,062 A | 3/1999 | Horii |
| 6,090,659 A | 7/2000 | Laibowitz et al. |
| 6,132,584 A | 10/2000 | Hubel |
| 6,137,206 A | 10/2000 | Hill |
| 6,229,166 B1 * | 5/2001 | Kim et al. ............... 257/295 |
| 6,255,187 B1 * | 7/2001 | Horii ....................... 438/396 |

* cited by examiner

Primary Examiner—Jey Tsai
(74) Attorney, Agent, or Firm—Morgan, Lewis & Bockius LLP

(57) ABSTRACT

A method for fabricating a capacitor of a semiconductor device includes steps of forming an insulating film on a surface of a substrate, forming a storage node contact hole in the insulating film, forming a plug within the storage node contact hole, forming a storage node of the capacitor over the plug, forming a high dielectric film on the surface of the substrate including the storage node, forming a seed layer on the high dielectric film, and forming an upper electrode of the capacitor on the seed layer.

20 Claims, 4 Drawing Sheets

METHOD FOR FABRICATING A CAPACITOR OF A SEMICONDUCTOR DEVICE

This application claims the benefit of Korean patent application No. P2001-18635, filed Apr. 9, 2001 in Korea, which is hereby incorporated by reference in its entirety.

BACKGROUND OF THE INVENTION

1. Field of the Invention

The present invention relates to a method for fabricating a semiconductor memory device, and more particularly, to a method for fabricating a capacitor of a semiconductor device by an electroplating process.

2. Background of the Related Art

Presently, tertiary inter-level dielectric (ILD) structures of a high dielectric that can be used in a chip size of 0.10 or less has excellent step coverage and deposition process steps at low temperature. However, the tertiary ILD structure has a problem in that an upper electrode of a refractory metal disposed on a TaON- or BST-based capacitor acts as a catalyst under the ambient of reduction, thereby degrading dielectric characteristics and leakage current characteristics. Furthermore, as a large gap occurs between adjacent storage nodes, degradation of the high dielectric oxide due to $H_2$ may be accelerated.

A related art method for fabricating a high dielectric capacitor of a semiconductor device will now be described with reference to the accompanying drawings.

FIG. 1 is a sectional view showing a related art capacitor structure of a semiconductor device.

In FIG. 1, an oxide film 1 is deposited on an entire surface of a substrate (not shown) to insulate the substrate from a capacitor. A nitride film 2 having excellent etching selectivity with the oxide film 1 is deposited on the oxide film 1. Portions of the nitride film 2 and the oxide film 1 located where the capacitor will be formed are selectively removed so that a contact hole is formed to connect a lower substrate with the capacitor. A polysilicon layer 3 is deposited on the entire surface by chemical vapor deposition (CVD) process and then patterned by etch-back process to remain lower than the depth of the contact hole.

After the substrate is washed, a refractory metal, i.e., a Ti layer is deposited on the entire surface of the substrate and then annealed so that the polysilicon layer 3 is reacted with the Ti layer. As a result, a metal silicide (TiSix) layer 4 is formed on the interface between the polysilicon layer 3 and the Ti layer. The portions of the Ti layer that do not react with the polysilicon layer 3 are selectively removed by a wet etching process. Subsequently, as a diffusion barrier layer, a barrier metal layer 5 such as TiN or a three-component based metal is deposited on the entire surface of the substrate. The barrier metal layer 5 is then planarized by a chemical mechanical polishing (CMP) process to expose a surface of the substrate.

A dummy PSG oxide film is thickly deposited on the entire surface of the substrate. A portion of the dummy PSG oxide film corresponding to where a lower electrode of the capacitor will be formed is selectively removed. Storage nodes 9 of the capacitor are then formed in a portion where the PSG oxide film is removed.

Subsequently, a high dielectric BST film 10 is deposited on the entire surface of the substrate by the CVD process. As an upper electrode, a Ru layer 12 is deposited on the BST film 10 by the CVD process. Next, a $H_2$ diffusion barrier film 13, $Al_2O_3$ film is formed. An inter-level dielectric layer 14 such as $SiO_2$ film is finally formed.

The related art method for fabricating a capacitor of a semiconductor device has several problems.

First, as a high dielectric film, the BST film is formed on the lower electrode of the capacitor, and the upper electrode and the inter-level dielectric layer are formed by the CVD process. Accordingly, step differences between cells occurs, thereby deteriorating yield.

Second, since the upper electrode and the $Al_2O_3$ film are deposited by the CVD process, the high dielectric film is reduced under the ambient of reduction. For this reason, it is likely that dielectric characteristic of the high dielectric film and leakage current characteristic may be degraded.

In other words, to form the inter-level dielectric layer ($SiO_2$) by the CVD process, $SiH_4$ gas and $O_2$ gas are injected into a chamber as source gases so that $SiO_2$ is deposited by reaction between the two gases. At this time, since a reaction gas ($H_2$) is generated, the chamber is under the ambient of reduction. However, as described above, a gap occurs between cells and the inter-level dielectric layer ($SiO_2$) is formed therebetween. Accordingly, even though $Al_2O_3$ film is formed as $H_2$ diffusion barrier film, it is likely that the high dielectric film may degrade dielectric characteristic and leakage current characteristic under the ambient of reduction.

SUMMARY OF THE INVENTION

Accordingly, the present invention is directed to a method for fabricating a capacitor of a semiconductor device that substantially obviates one or more of the problems due to limitations and disadvantages of the related art.

An object of the present invention is to provide a method for fabricating a capacitor of a semiconductor device in which an upper electrode of the capacitor is formed by an electroplating method so that a gap between adjacent storage nodes is filled, thereby improving step coverage.

Another object of the present invention is to provide a method for fabricating a capacitor of a semiconductor device in which leakage current characteristics of a high dielectric film of the capacitor is not degraded.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for fabricating a capacitor of a semiconductor device includes the steps of forming an insulating film on a surface of a substrate, forming a storage node contact hole in the insulating film, forming a plug within the storage node contact hole, forming a storage node of the capacitor over the plug, forming a high dielectric film on the surface of the substrate including the storage node, forming a seed layer on the high dielectric film, and forming an upper electrode of the capacitor on the seed layer.

In another aspect, the method for fabricating a capacitor of a semiconductor device includes steps of forming an insulating film on a surface of a substrate, forming a storage node contact hole in the insulating film, forming a plug within the storage node contact hole, forming a storage node of the capacitor over the plug, the storage node includes a convex upper surface, forming a high dielectric film on the surface of the substrate including the storage node, forming a seed layer on the high dielectric film, and forming an upper electrode of the capacitor on the seed layer.

In another aspect, the method for fabricating a capacitor of a semiconductor device includes steps of forming an insulating film on a surface of a substrate, forming a storage node contact hole in the insulating film, forming a plug within the storage node contact hole, forming a first seed layer on the surface of the substrate, forming a glue layer on the first seed layer, forming a dummy layer on the glue layer, removing portions of the dummy layer and the glue layer in a first region, forming the storage node in the first region, removing the first seed layer, forming a high dielectric film on the surface of the substrate including the storage node, forming a second seed layer on the high dielectric film, and forming an upper electrode of the capacitor on the second seed layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
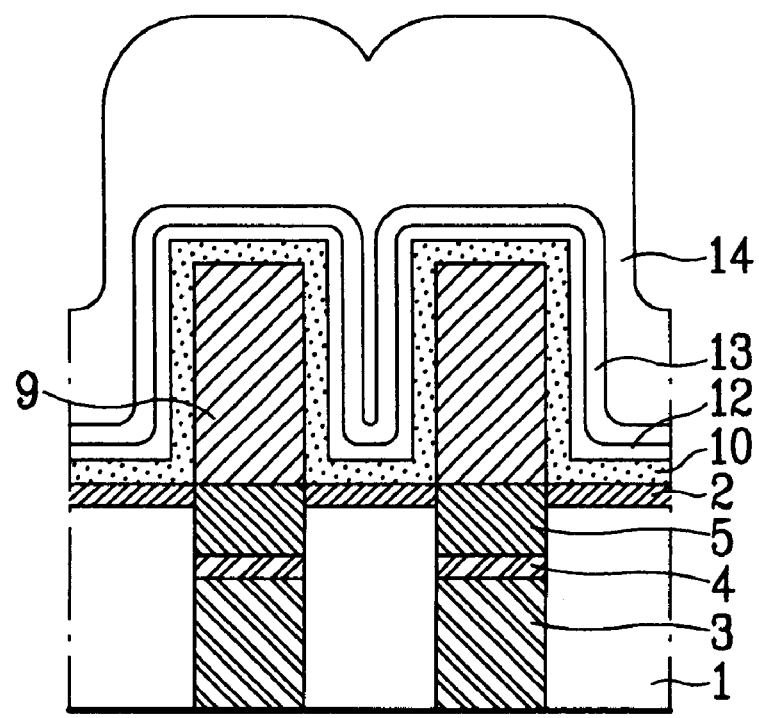
FIG. 1 is a sectional view showing a related art capacitor structure of a semiconductor device.
Figure 2A:
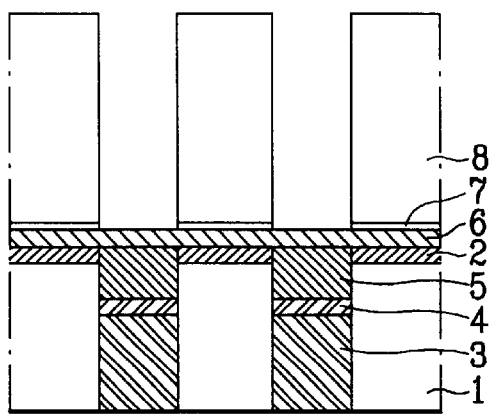
FIGS. 2A to 2G are sectional views of process steps showing an exemplary method for fabricating a capacitor of a semiconductor device according to the present invention.

In FIG. 2A, an oxide film 1 may be deposited on an entire surface of a substrate (not shown), and a nitride film 2 having excellent etching selectivity with the oxide film 1 may be deposited on the oxide film 1 to a thickness of about 300 Å~1000 Å. Portions of the nitride film 2 and the oxide film 1 located where the capacitor will be formed may be selectively removed so that a contact hole is formed to connect the capacitor with to a portion of the substrate. A polysilicon layer 3 may be deposited on the entire surface by a CVD process to a thickness of about 300 Å~1000 Å. The polysilicon layer 3 may then be patterned by an etch-back process to remain lower than the depth of the contact hole. That is, the polysilicon layer 3 is patterned to a thickness of about 500 Å~500 Å to remain in a portion of the contact hole.

After the substrate is washed, a refractory metal of titanium (Ti), for example, may be deposited on the entire surface of the substrate to a thickness of about 100 Å~1000 Å and then annealed so that the polysilicon layer 3 reacts with the Ti layer. As a result, a metal silicide (TiSix) layer 4 may be formed on the interface between the polysilicon layer 3 and the Ti layer. Portions of the Ti layer that do not react with the polysilicon layer 3 may be selectively removed by a wet etching process, for example. Subsequently, as a diffusion barrier layer, a barrier metal layer 5 of TiN or a three-component based metal such as TiSiN, TiAlN, TaSiN, and TaAlN, for example, may be deposited on the entire surface of the substrate by a PVD or CVD process, for example. The barrier metal layer 5 may then be planarized by a CMP process.

For an electroplating process, a seed layer 6 such as Ru, for example, may be deposited on the entire surface of the substrate to a thickness of about 50 Å~1000 Å. A glue layer 7 may be formed on the Ru seed layer 6 to a thickness of about 50 Å~500 Å by a PVD or CVD process, for example, to improve adhesion between the Ru seed layer 6 and an oxide film which will be formed later. At this time, Ti, TiOx, TiN, TiAlN, or TiSiN, for example, may be used as the glue layer 7.

Subsequently, a dummy PSG oxide film 8 may be thickly deposited on the glue layer 7 to a thickness of about 10000 Å~15000 Å. Portions of the dummy PSG oxide film 8 and the glue layer 7 that correspond to a portion where a lower electrode of the capacitor will be formed are selectively removed.

Figure 2B:
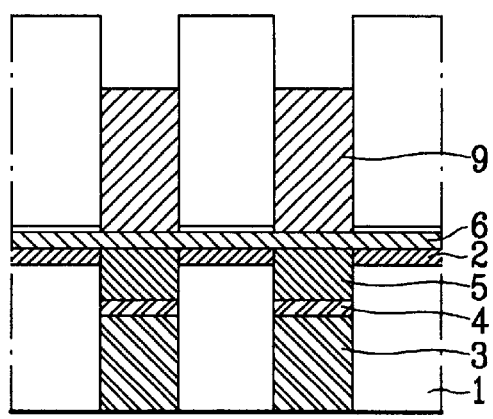

In FIG. 2B, a platinum (Pt) layer may be deposited on a portion, where the dummy PSG oxide film 8 is removed, to a thickness of about 9000 Å~14000 Å by an electroplating method, thereby forming storage nodes 9 of the capacitor. At this time, a voltage may be applied to the seed layer 6 so that the Pt layer is selectively formed in a portion where the seed layer 6 is exposed. Also, when the storage nodes 9 are formed by the electroplating method, Pt, Ir, Os, W, Mo, Co, Ni, Au, or Ag, for example, may be used as the seed layer 6, and Ru, Pt, or TiN may be used as the storage nodes 9.

Figure 2C:
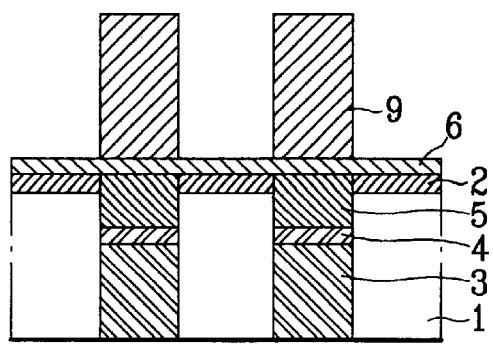

In FIG. 2C, the dummy PSG oxide film 8 and the glue layer 7 may be removed by a wet etching process, for example.

Figure 2D:
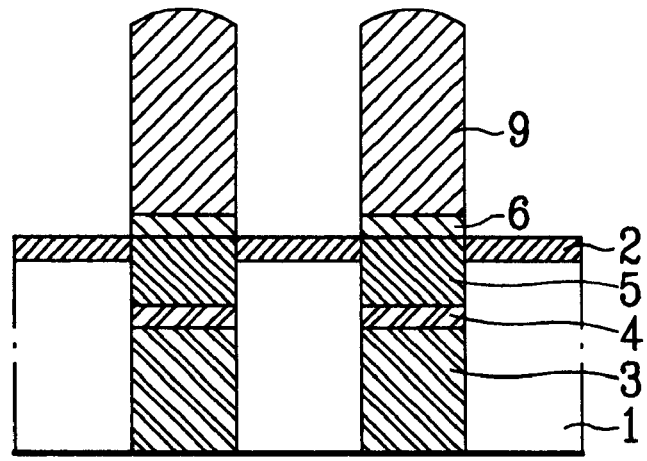

In FIG. 2D, to insulate the storage nodes 9 of the capacitor from each other, portions of the seed layer 6 disposed between the storage nodes 9 may be removed by a dry etching process, for example. At this time, corner portions of the storage nodes 9 (Pt layer) may also be removed, so that the corner portions of the storage nodes 9 are rounded, thereby forming convex upper surfaces of the storage nodes.

Figure 2E:
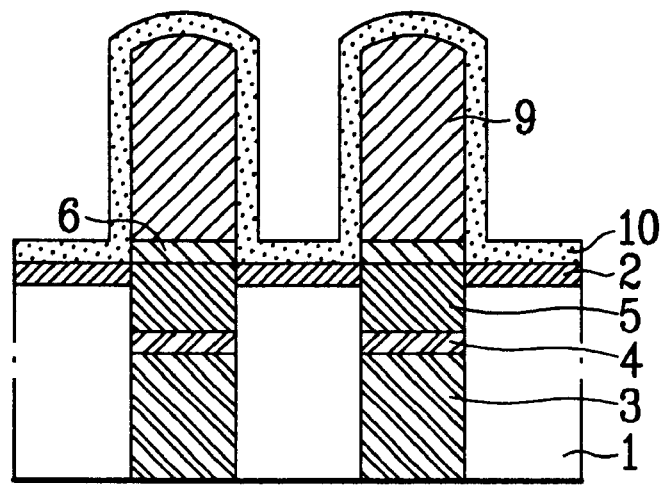

In FIG. 2E, a high dielectric BST film 10 may be deposited on the entire surface by a CVD process, for example, and then annealed (RTP), thereby increasing crystallization of the BST film 10. At this time, the BST film 10 may be deposited to a thickness of about 50 Å~200 Å within a temperature range of about 400° C.~600° C. and annealed for about 30~180 seconds under the ambient of $N_2$ at a temperature of about 500° C.~700° C.

Figure 2F:
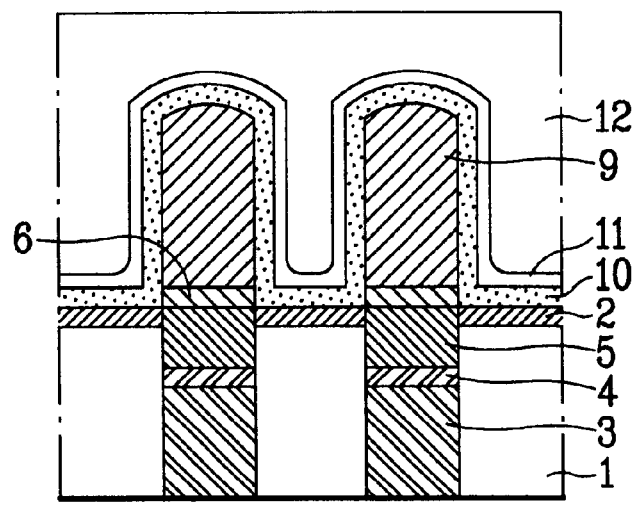

In FIG. 2F, an electroplating method may be used wherein an Ru seed layer 11 is deposited on the BST film 10 to a thickness of about 50 Å~100 Å by a CVD process, for example, thereby forming an upper electrode 12 to a thickness of about 1000 Å~5000 Å. At this time, a current density used for the electroplating method is in a range of about 0.1~10 mA/cm$^2$, wherein DC power, pulse power or reverse pulse power may be used. Accordingly, since the upper electrode 12 are formed by the electroplating method, a gap between adjacent storage nodes may be filled and the upper electrode is planarized. Furthermore, when the upper electrode is formed by the electroplating method, Pt, Ir, Os, W, Mo, Co, Ni, Au, or Ag may be used as the seed layer 11, and Ru, Pt, or TiN may be used as the upper electrode 12.

Figure 2G:
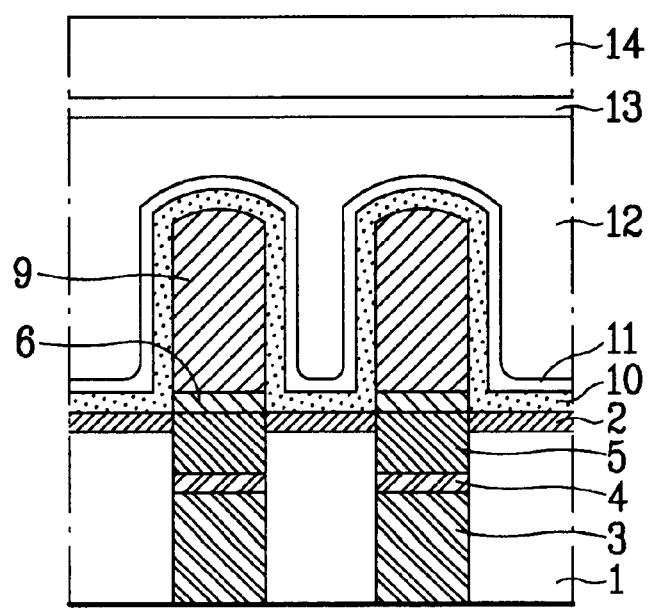

In FIG. 2G, an $Al_2O_3$ film may be deposited on the entire surface of the upper electrode 12 by an atomic layer deposition process, for example, thereby forming a $H_2$ diffusion barrier film 13. An inter-level dielectric layer 14 such as $SiO_2$, for example, may be formed on the $H_2$ diffusion barrier film 13, thereby completing the capacitor of the semiconductor device.

As aforementioned, the method for fabricating a capacitor of a semiconductor substrate according to the present invention has the following advantages. Since the upper electrode of the capacitor is formed by an electroplating method, the gap between adjacent storage nodes is filled, thereby improving step coverage, simplifying processing steps, increasing reliability, and improving a $H_2$ diffusion barrier effect. That is, since the upper electrode is filled between adjacent storage nodes, even if the processing chamber is under the ambient of reduction when the inter-level dielectric layer (oxide film) is deposited, it is possible to more effectively prevent $H_2$ diffusion.

It will be apparent to those skilled in the art that various modifications and variations can be made in the method of fabricating a capacitor of a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor of a semiconductor device, comprising the steps of:

forming an insulating film on a surface of a substrate;

forming a storage node contact hole in the insulating film;

forming a plug within the storage node contact hole;

forming a storage node of the capacitor over the plug, the storage node includes a convex upper surface;

forming a high dielectric film on the surface of the substrate including the storage node;

forming a seed layer on the high dielectric film; and forming an upper electrode of the capacitor on the seed layer.

2. The method according to claim 1, wherein the step of forming an upper electrode includes an electroplating process with a current density of about 0.1~10 mA/cm$^2$.

3. The method according to claim 1, further comprising the step of sequentially forming an $H_2$ diffusion barrier film and an inter-level dielectric layer on the upper electrode.

4. The method according to claim 3, wherein the $H_2$ diffusion barrier film is formed of $Al_2O_3$ by an atomic layer deposition process to a thickness of about 50 Å~200 Å and the inter-level dielectric layer includes $SiO_2$.

5. The method according to claim 1, wherein the insulating film includes a layered structure of an oxide film and a nitride film of about 300 Å~1000 Å.

6. The method according to claim 1, wherein the step of forming the plug includes the steps of:

forming a polysilicon layer lower than a depth of the contact hole;

forming a metal silicide layer on the polysilicon layer; and forming a barrier metal layer on the metal silicide layer at a surface height of the insulating film.

7. The method according to claim 6, wherein the step of forming a polysilicon layer includes deposition by a CVD process and patterning by an etch-back process.

8. The method according to claim 6, wherein the metal silicide layer includes TiSix, and the barrier metal layer includes at least one of TiN, TiSiN, TiAlN, TaSiN, and TaAlN.

9. The method according to claim 1, wherein the step of forming the storage node includes the steps of:

forming a seed layer on the surface of the substrate;

forming a glue layer on the seed layer;

forming a dummy layer on the glue layer;

removing portions of the dummy layer and the glue layer in a first region;

forming the storage node in the first region; and removing the seed layer.

10. The method according to claim 9, wherein the step of forming the storage node includes an electroplating process.

11. The method according to claim 9, wherein the seed layer is about 50 Å~1000 Å thick and the glue layer is about 50 Å~500 Å thick.

12. The method according to claim 9, wherein the seed layer includes at least one of Ru, Pt, Ir, Os, W, Mo, Co, Ni, Au, and Ag, the glue layer includes at least one of Ti, TiOx, TiN, TIAlN, and TiSiN, and the storage node includes one of Ru, Pt, and TiN.

13. The method according to claim 1, wherein the step of forming the high dielectric film includes the steps of:

depositing a BST film on the entire surface of the substrate to a thickness of about 50 Å~200 Å; and annealing the BST film.

14. The method according to claim 13, wherein the step of depositing a BST film includes a CVD process at a temperature of about 400° C.~600° C.

15. The method according to claim 13, wherein the step of annealing is performed for about 30~180 seconds under an ambient of $N_2$ at a temperature of about 500° C.~700° C.

16. The method according to claim 1, wherein the seed layer is about 50 Å~1000 Å thick, and the upper electrode of the capacitor is about 1000 Å~5000 Å thick.

17. The method according to claim 1, wherein the seed layer includes at least one of Ru, Pt, Ir, Os, W. Mo, Co, Ni, Au, and Ag, and the upper electrode includes at least one of Ru, Pt, and TiN.

18. The method according to claim 1, wherein the upper electrode is formed to fill a gap between adjacent storage nodes.

19. A method for fabricating a capacitor of a semiconductor device, comprising the steps of:

forming an insulating film on a surface of a substrate;

forming a storage node contact hole in the insulating film;

forming a plug within the storage node contact hole;

forming a storage node of the capacitor over the plug, the storage node includes a convex upper surface;

forming a high dielectric film on the surface of the substrate including the storage node;

forming a seed layer on the high dielectric film; and forming an upper electrode of the capacitor on the seed layer.

20. A method for fabricating a capacitor of a semiconductor device, comprising the steps of:

forming an insulating film on a surface of a substrate;

forming a storage node contact hole in the insulating film;

forming a plug within the storage node contact hole;

forming a first seed layer on the surface of the substrate;

forming a glue layer on the first seed layer;

forming a dummy layer on the glue layer;

removing portions of the dummy layer and the glue layer in a first region;

forming the storage node in the first region;

removing the first seed layer;

forming a high dielectric film on the surface of the substrate including the storage node;

forming a second seed layer on the high dielectric film; and forming an upper electrode of the capacitor on the second seed layer.

* * * * *